United States Patent [19]
Samueli et al.

[11] Patent Number: 5,754,591
[45] Date of Patent: May 19, 1998

[54] SYSTEM FOR, AND METHOD OF, PROCESSING QUADRATURE AMPLITUDE MODULATED SIGNALS

[75] Inventors: Henry Samueli, Northridge; Charles P. Reames, Lakewood, both of Calif.

[73] Assignee: Broadcom Corporation, Irvine, Calif.

[21] Appl. No.: 285,504

[22] Filed: Aug. 3, 1994

[51] Int. Cl.$^6$ .................... H03H 7/30; H03H 7/40
[52] U.S. Cl. .................. 375/235; 375/261; 375/326; 375/344; 375/345; 375/373; 329/307
[58] Field of Search ...................... 375/229, 232, 375/233, 235, 261, 266, 326, 344, 345, 346, 349, 371, 373; 329/304, 307

[56] References Cited

U.S. PATENT DOCUMENTS

| | | | |
|---|---|---|---|
| 3,962,637 | 6/1976 | Motley et al. | 375/232 |
| 4,253,184 | 2/1981 | Gitlin et al. | 375/232 |
| 4,599,732 | 7/1986 | LeFever | 375/346 |
| 5,386,239 | 1/1995 | Wang et al. | 348/472 |
| 5,400,366 | 3/1995 | Iwamatsu | 375/344 |

*Primary Examiner*—Don N. Vo
*Attorney, Agent, or Firm*—Ellsworth R. Roston; Fulwider Patton Lee & Utecht, LLP

[57] ABSTRACT

Analog signals encoded with quadrature amplitude modulation (QAM) pass through a coaxial cable at a particular baud rate. These signals have a carrier frequency individual to the TV station being received. They are mixed with signals from a variable frequency oscillator to produce signals at a particular intermediate frequency (IF). An analog-digital converter (ADC) converts the IF signals to corresponding digital signals which are demodulated to produce two digital signals having a quadrature phase relationship. After being filtered and derotated, the digital signals pass to a symmetrical equalizer including a feed forward equalizer (FFE) and a decision feedback equalizer (DFE) connected to the FFE in a feedback relationship. The DFE may include a slicer providing amplitude approximations of increasing sensitivity at progressive times. Additional slicers in the equalizer combine the FFE and DFE outputs to provide the output data without any of the coaxial cable noise or distortions. The equalizer outputs and initially the derotation outputs, and the slicer outputs, servo (1) the oscillator frequency to obtain the IF frequency, (2) the ADC sampling clock to obtain the digital conversion at a rate related to the particular baud rate and (3) the derotator. The servos may have (1) first constants initially after a change in the station selection and (2) second time constants thereafter. The ADC gain is also servoed (1) initially in every ADC conversion and (2) subsequently in every nth ADC conversion where n=integer>1. The above recover the QAM data without any of the coaxial cable noise or distortions.

81 Claims, 5 Drawing Sheets

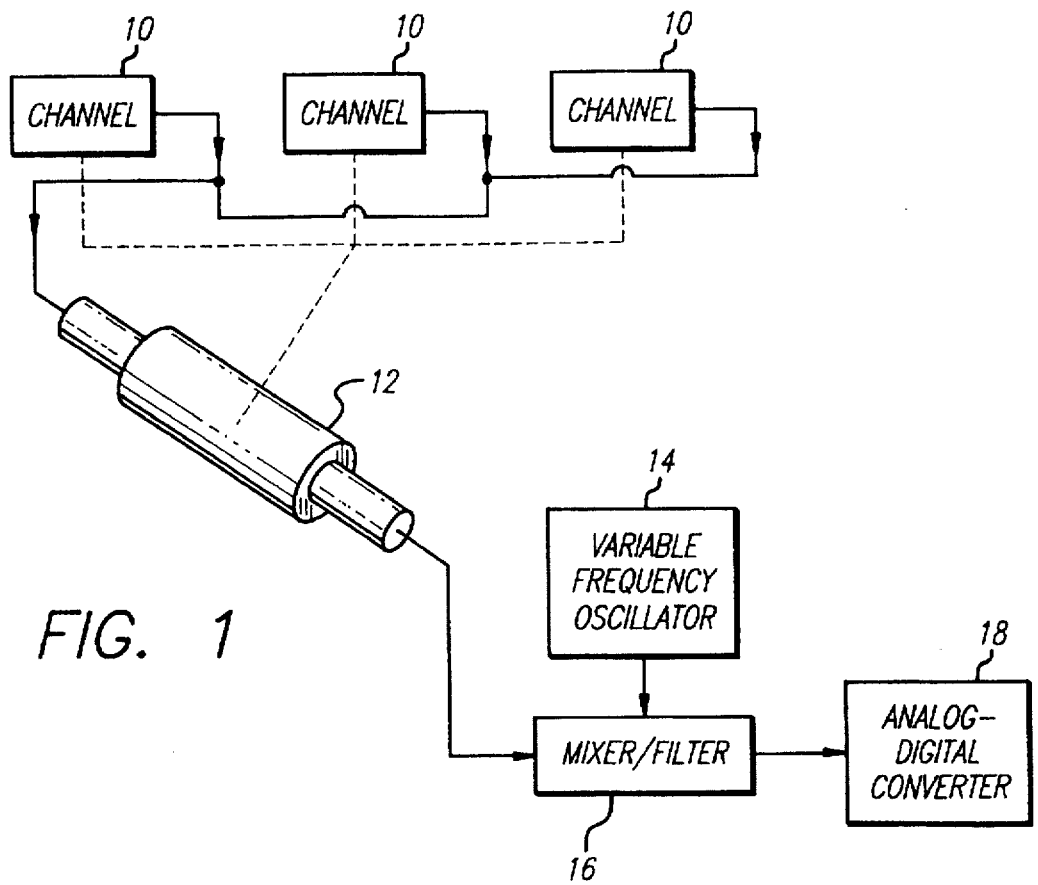
FIG. 1
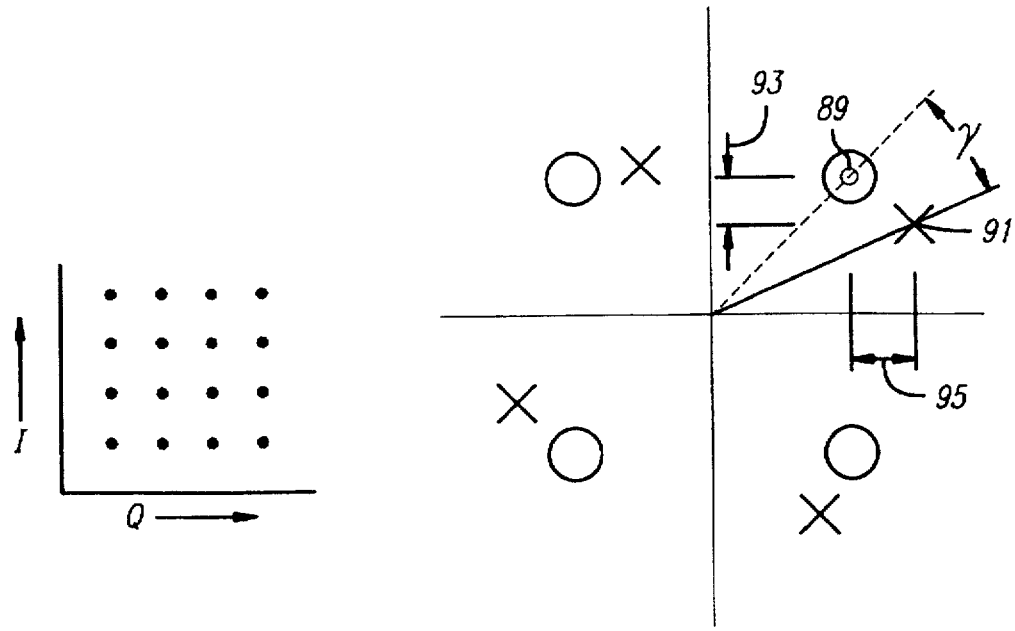
FIG. 4
FIG. 7

SYSTEM FOR, AND METHOD OF, PROCESSING QUADRATURE AMPLITUDE MODULATED SIGNALS

This invention relates to systems for, and methods of recovering digitally modulated television signals from the noise and distortion in coaxial cables. More particularly, this invention relates to systems for, and methods of, recovering quadrature amplitude modulated signals from the noise and distortion in coaxial cables. In these systems and methods, quadrature amplitude modulation is used to transmit the television information. The systems and methods of this invention use digital techniques to recover the quadrature amplitude modulated signals from the noise and distortion in the coaxial cables.

BACKGROUND OF THE INVENTION

Modern digital telecommunication systems are operating at ever-increasing data rates to accommodate society's growing demands for information exchange. However, increasing the data rates, while at the same time accommodating the fixed bandwidths allocated by the Federal Communications Commission (FCC), requires increasingly sophisticated signal processing techniques. Since low cost, small size and low power consumption are important in the hardware implementations of such communications systems, custom integrated-circuit solutions are important in achieving these goals.

Next-generation digital television systems such as proposed cable television (CATV) and high-definition television (HDTV) will rely on transceivers to deliver data at rates in excess of thirty megabits per second (30 Mb/s). Quadrature amplitude modulation (QAM) techniques, used in high-speed modems and digital radio systems, represent a promising transmission format for CATV and HDTV systems. In quadrature amplitude modulation (QAM) systems, a pair of amplitude modulated signals having a quadrature (90°) phase relationship to each other are summed to transmit the television signals through the coaxial cable.

There are problems in the use of quadrature amplitude modulation for CATV and HDTV systems. One significant problem is that a considerable amount of noise and distortion is generated in the coaxial cables. Such distortion may result in CATV systems in part from impedance mismatches and reflections from unterminated stubs. In HDTV systems, the distortion may result in part from multi-path reflections. Such distortion is so significant that it impairs a good reception of the television signals.

Until now, analog systems have been proposed to recover the quadrature amplitude modulated data from the analog CATV and HDTV signals in the coaxial cables. Such systems have been disadvantageous because they have not been able to eliminate a significant amount of the noise and distortion in the coaxial cables. Even with their inefficiencies, they have required large amounts of power and considerable space.

BRIEF DESCRIPTION OF THE INVENTION

This invention recovers the quadrature amplitude modulated data by using digital techniques. The current embodiment of the invention uses only three (3) integrated circuit chips to provide such recovery. The invention recovers the quadrature amplitude modulated data while eliminating substantially all of the noise and distortion in the coaxial cables. The invention also provides for an increased speed of operation, thereby being capable of handling television signals transmitted at increased baud rates. The three (3) integrated circuit chips consume a relatively low amount of power and occupy a relatively small space. Steps are now being taken to provide in a single chip the system now provided in three (3) chips. This chip will occupy even less space and consume less power than the three (3) chip system.

In one embodiment of the invention, analog signals encoded with quadrature amplitude modulations (QAM) on a carrier frequency individual to a selected TV station pass through a coaxial cable at a particular baud rate. The analog signals from a variable frequency oscillator to produce signals at a particular intermediate frequency (IF). An analog-digital converter (ADC) converts the intermediate frequency (IF) signals to corresponding digital signals which are demodulated to produce two quadrature phrase digital signals.

After being filtered and derotated, the two digital signals pass to a symmetrical equalizer including a feed forward equalizer (FFE) and a decision feedback equalizer (DFE) connected to the FFE in a feedback relationship. The DFE may include a slicer providing amplitude approximations of increasing sensitivity at progressive times. Additional slicers in the equalizer combine the FFE and DFE outputs to provide the output data without any of the coaxial cable noise or distortions.

The equalizer outputs, and initially the derotation outputs and subsequently the slicer outputs, servo (1) the oscillator to obtain the IF frequency, (2) the ADC sampling clock to obtain the digital conversion at a rate having a particular relationship to the particular baud rate and (3) the derotator. The servos may have (1) first constants initially after the selected TV channel is changed and (2) second time constants thereafter. The ADC gain is also servoed (1) initially in every ADC conversion and (2) subsequently in every nth ADC conversion where n=integer>1. The above recover the QAM data without any of the noise or distortion in the coaxial cable.

BRIEF DESCRIPTION OF THE DRAWINGS

In the drawings:

FIG. 1 is a diagram schematically illustrating a system for transmitting analog television signals (video and audio) from a selected one of a number of channels or stations through a coaxial cable for reception by a subscriber, the analog signals having been encoded using quadrature amplitude modulation;

FIG. 4 is a simplified schematic diagram illustrating how the derotator and equalizer included in the embodiment of FIGS. 2A and 2B produce an undistorted quadrature amplitude modulation constellation corresponding to the quadrature amplitude modulation signal generated by the transmitting station;

FIG. 7 is a schematic diagram illustrating how certain closed loop servos included in the embodiment of FIGS. 2A and 2B operate when the equalizer chip shown in FIG. 2 provides a QAM constellation with a phase rotation displaced from the QAM constellation transmitted through the coaxial cable by the selected station;

DETAILED DESCRIPTION OF THE INVENTION

Figure 2A:
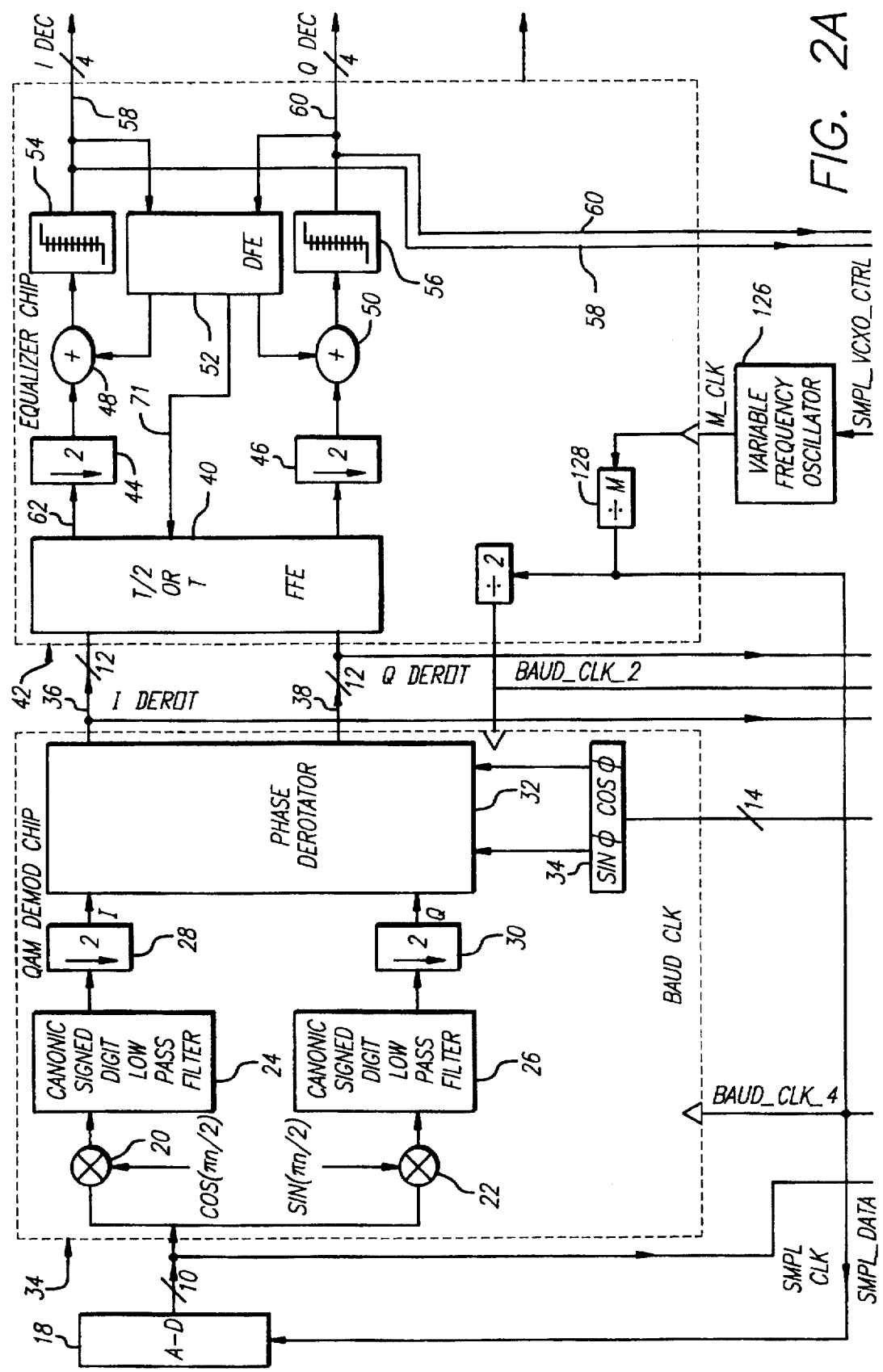
FIGS. 2A and 2B collectively constitute a circuit diagram, primarily in block form, of a system constituting one embodiment of the invention for recovering the quadrature amplitude modulated signals from the noise and distortion in the coaxial cable.

In one embodiment of the invention, a plurality of television stations or channels 10 (FIG. 1) are provided to transmit television signals (video and audio) through a coaxial cable 12 to a receiver (not shown). Each of the television channels 10 provides a carrier signal at a frequency individual to such channel. The carrier frequency for the lowest one of the stations or channels 10 may be approximately thirty (30) megahertz (30 MHz) and the carrier frequency for the highest one of the stations or channels may have a value of approximately seven hundred and fifty megahertz (750 MHz). The separation in frequency between adjacent pairs of channels may be approximately six megahertz (6 MHz).

The television signals (video and audio) are digitally compressed and encoded and transmitted through the coaxial cable 12 using quadrature amplitude modulation. The television signals modulated as described above are transmitted through the coaxial cable 12 at a particular baud rate. The signals may be compressed by an amount depending upon the baud rate.

A system as described above is well known in the art. Such a system is being proposed to transmit cable television (CATV) signals and is proposed for use to transmit high definition television signals (HDTV) through a coaxial cable such as the cable 12.

As the modulated television signals are transmitted through the coaxial cable 12, noise and distortion develop in the coaxial cable. The distortion may develop from a number of factors. For example, the distortion may develop in cable television systems from impedance mismatches and reflections from unterminated stubs. In high definition broadcast television signals, the distortion may result from multi-path reflections. The distortion in the coaxial cable 12 is so significant that it may prevent the QAM signal from being recovered. The QAM signal has to be recovered in order for the television signals (audio and video) to be processed in the set-top box.

This invention provides a system for, and method of, processing the analog signals in the coaxial cable 12 for any selected one of the individual channels 10 to recover the quadrature amplitude modulated data for such channel from the noise and distortion in the coaxial cable. When the quadrature amplitude modulated data has been recovered by the system of this invention, the television signals (video and audio) for the selected channel 10 can be processed by known techniques to obtain the image and the sound being transmitted in that channel.

The analog signals in the coaxial cable 12 are introduced to a mixer/filter 16 and an oscillator 14 having a variable frequency. The oscillator 14 may preferably be a voltage controlled oscillator whose frequency is varied in accordance with variations in the voltage introduced to the oscillator. As will be described subsequently, the voltage introduced to the oscillator 14 is varied to have the frequency of the oscillator be separated by an intermediate frequency (IF) such as five megahertz (5 MHz) from the individual one of the channels or stations 12 selected at any instant. These signals are mixed in a mixer/filter 16 with the carrier signals in the coaxial cable 12 to produce the intermediate frequency (IF) signal of five megahertz (5 MHz).

Figure 3:
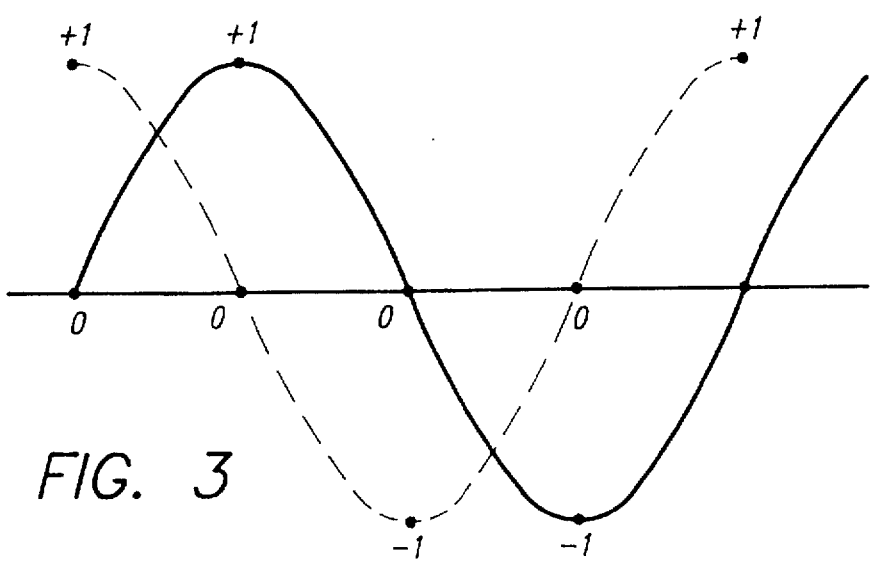
FIG. 3 is a schematic diagram illustrating how a cosine signal is generated in one of the stages of FIG. 2 on a digital basis.

The IF analog signals are then introduced to an analog-to-digital converter 18 (FIGS. 1 and 2A). As will be seen subsequently, the converter 18 operates on the analog signals at four (4) times the baud rate of the selected one of the channels 10 and converts the analog signals to digital signals at this baud rate. The digital signals are then introduced to a pair of multipliers 20 and 22 in FIG. 2A. The multiplier 20 multiplies the digital signals by a cosine function and the multiplier 22 multiplies the digital signals by a sine function. The multiplication by the cosine function occurs from a phase standpoint at progressive 90° intervals. Thus the multiplication occurs with successive digital values of +1.0, −1.0,+1.0,−1.0, etc. In like manner, the multiplication of the digital signals by the sine function occurs at 90° intervals as by successive digital values of 0,+1,0,−1,0,+1, 0,−1, etc. The sine and cosine functions formulated as specified above are shown in FIG. 3. The sine function is shown in a solid line and the cosine function is shown in broken lines.

Since the multiplication by each of the sine and cosine functions occurs at four times the baud rate, each of the multipliers 20 and 22 produces signals at a frequency four (4) times the baud rate. The signals from the multipliers 20 and 22 are respectively introduced to canonic signed digit low pass filters 24 and 26. Such low pass filters are well known in the art. For example, they are disclosed in an article entitled "A 200 MHz, All-Digital QAM Modulator and Demodulator in 1.2-um CMOS for Digital Radio Applications" written by Bennett C. Wong and Henry Samueli and published in the IEEE Journal of Solid-State Circuits in December 1991. One advantage of such a low pass filter is that it employs a series of adders rather than multipliers as in other filters. Adders are distinctly advantageous over multipliers because they are considerably less complicated in construction and operation than multipliers. This provides for simplicity in the construction and operation of the low pass filters and for a minimal dissipation of power in the filters.

The frequency of the signals from the low pass filters 24 and 26 is divided by two (2) in a pair of stages 28 and 30. The dividers 28 and 30 are disclosed in the article specified in the previous paragraph. After such division, the frequency of the digital signals is still two (2) times the baud rate of the quadrature amplitude modulated data in the coaxial cable 12. The signals from the dividers 28 and 30 are then introduced to a phase derotator 32. The phase derotator 32 is considered to be one (1) of the novel features of this invention. The phase derotator 32 multiplies the baseband digital signals from the dividers 28 and 30 by the trigonometric functions sin $\theta$ and cos $\theta$. These trigonometric functions have a sampling frequency corresponding to that of the digital signals from the dividers 28 and 30. The functions cosine $\theta$ and sine $\theta$ are supplied by a stage 34.

If the output from the divider 28 is considered as I and the output from the divider 30 is considered as Q, the multiplications provided in the derotator 32 may be indicated as I cos ∅
Q sin ∅
I sin ∅
Q cos ∅

The multiplicands listed above may be combined in pairs as

I cos ∅–Q sin ∅ and
I sin ∅–Q cos ∅ to produce outputs on lines 36 and 38 of the phase derotator.

If the phases of the pairs of the signals I cos ∅–Q sin ∅ and I sin ∅–Q cos ∅ do not match the phases of the transmitted QAM constellation, there will be a rotation of the signals. This may be seen from FIG. 4 where four (4) columns and four (4) rows are shown and where Q is shown on the horizontal axis and I is shown on the vertical axis. When the phases of I and Q are properly aligned, the QAM constellation will have the relationship shown in FIG. 4. In this relationship, the I values have a perpendicular relationship and are stationary and the Q values have a horizontal relationship and are stationary. If the phases of I and Q are not properly aligned with the transmitted QAM constellation, the I and Q constellation will spin at a rate dependent upon the differences in phase between the I and Q constellation on the one hand and the transmitted QAM constellation in the coaxial cable 12 on the other hand.

The stages 20, 22, 24, 26, 28, 30 and 32 have been included in an integrated circuit chip generally indicated at 34 in FIG. 2A. This chip is designated in FIG. 2A as QAM DEMOD CHIP and is shown in broken lines. The signals from the phase derotator 32 in the integrated circuit chip 34 pass through the lines 36 and 38 to a feed forward equalizer (FFE) 40 in an integrated circuit chip generally indicated at 42. The chip 42 is designated in FIG. 2 as an "EQUALIZER CHIP" and is shown in broken lines. A suitable feed forward equalizer 40 is disclosed in an article entitled "A 100 MHz, 5 MBaud Decision Feedback Equalizer for Digital Television Applications" written by Robindra B. Joshi and Henry Samueli and published in the IEEE International Solid-States Circuits Conference on Feb. 16, 1994. The feed forward equalizer 40 may perform either a T-spaced function or a T/2-spaced function.

The rate of occurrence of the outputs from the feed forward equalizer 40 is divided in the chip 42 by a pair of stages 44 and 46. Each of these divisions is by a factor of two (2). This causes the digital signals from the dividers 44 and 46 to have the baud rate of the analog signals introduced to the converter 18. The signals from the dividers 44 and 46 are respectively introduced to adders 48 and 50 as are outputs from a decision feedback equalizer 52. The adders 48 and 50 and the decision feedback equalizer 52 are included in the equalizer chip 42. The decision feedback equalizer 52 and the combination of the stages in the equalizer chip 42 are considered to be new to this invention.

Figure 9:
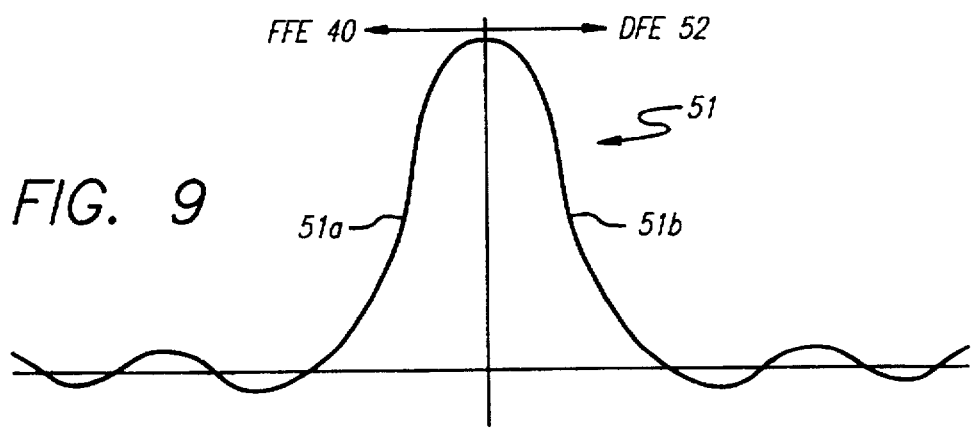
FIG. 9 illustrates how filters included in the equalizer chip shown in FIG. 2 produce different parts of the composite QAM signal which is free of the distortion in the coaxial cable.

The adder 48 adds the outputs of the feed forward equalizer 40 and the decision feedback equalizer 52 to provide an output which is introduced to a slicer 54. This addition may be seen from FIG. 9. As will be seen, a composite signal generally indicated at 51 is shown as being comprised respectively of left and right halves 51a and 51b. The feed forward equalizer 40 may be considered to correct for distortions in the left half 51a of the composite signal 51 and the decision feedback equalizer 52 may be considered to correct for distortions in the right half 51b of the composite signal 51. The adder 48 accordingly provides the binary value of the composite signal 51.

The outputs from the adders 48 and 50 are shown in FIG. 2A as being respectively introduced to a pair of slicers 54 and 56. Slicers such as the slicers 54 and 56 are considered to be known in the art. Each of the slicers 54 and 56 operates to provide a plurality (such as eight (8)) of progressive values and to determine the particular one of the eight (8) values closest to the output of the associated adder. For example, the slicer 54 selects a particular one of the eight (8) values closest to the output of the adder 48 and then provides this output on a line 58. Similarly, the slicer 56 selects a particular one of the eight (8) values closest to the output of the adder 50 and then provides this output on a line 60. The slicers 54 and 56 are included in the integrated circuit chip 42.

As will be seen in FIG. 2A, the stages on the integrated circuit chip 42 are symmetrical with respect to the I and Q channels. The symmetry is provided because of the symmetrical relationship of the stages 44, 48 and 54 between the equalizers 40 and 52 and the stages 46, 50 and 56 between the equalizers. The symmetrical relationship of the stages in the integrated circuit chip 42 facilitates an optimal detection of the quadrature amplitude modulated signals on the lines 58 and 60 with much less complexity than an asymmetrical structure. The symmetrical structure is practical when the analog-digital converter 18 operates on the IF signal. When the analog-digital converter operates on the baseband I and Q signals, an asymmetrical structure is required. This increases the complexity of the hardware.

Figure 5:
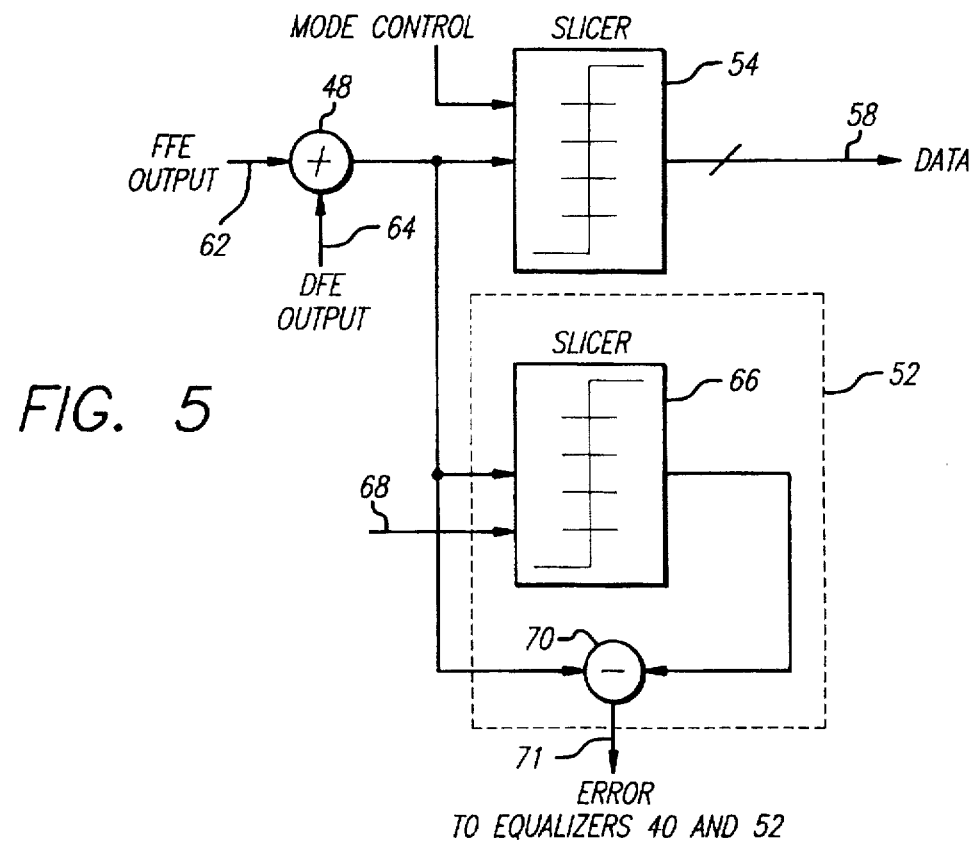
FIG. 5 is a circuit diagram, primarily in block form, illustrating in additional detail data and error slicer stages in an equalizer chip shown in FIG. 2A.

FIG. 5 illustrates certain of the stages in FIG. 2A in additional detail. FIG. 5 shows the adder 48 and the slicer 54 also shown in FIG. 2A. FIG. 5 also shows the output from the feed forward equalizer 40 on a line 62 and the output from the decision feedback equalizer 52 on a line 64, both of these outputs being introduced to the adder 48. As in FIG. 2A, the output of the adder 48 is shown as being introduced to the slicer 54. The output of the adder 48 is also shown in FIG. 5 as being introduced to the input of a slicer 66 which is included in the decision feedback equalizer 52 shown in broken lines in FIG. 5. The slicer 66 also receives a control input on a line 68. The output of the slicer 66 is introduced to a stage 70 which determines the difference between the output of the slicer 66 and the output of the adder 48. The output of the stage 70 is introduced on a line 71 to both the feed forward equalizer 40 and the decision feedback equalizer 52 also shown in FIG. 2A. This output may be considered to constitute the error feedback from the slicer 66 to the feed forward equalizer 40 and the decision feedback equalizer 52 in FIG. 2A.

The control line 68 receives successive binary indications from a microprocessor 72 (FIG. 2B) of two (2), four (4), eight (8) and sixteen (16) binary values. These respectively represent the square roots of four (4), sixteen (16), sixty four (64) and two hundred and fifty six (256). When the control line 68 in FIG. 5 receives a binary indication of two (2), the slicer 66 selects the binary value from the adder 48 closest to the two (2) progressive binary values in the slicer 66 and substitutes the closest of these two (2) values in the slicer 66 as the output from the slicer 66.

After a fixed period of time preset into the microprocessor 72, the slicer 66 provides four (4) progressive binary values and determines which one of these four (4) progressive binary values is closest to the binary value now provided as the output from the slicer. After an additional fixed period of time preset by the microprocessor 72, the slicer 66 again increases the number of progressive binary values, this time to eight (8). The slicer 66 then determines the individual one of the eight (8) progressive binary values closest to the adjusted input to the slicer 66 and selects this individual one of the progressive binary values as the new adjusted output from the slicer 66. If the receiver is operating in the 256-QAM mode, then, after another fixed period of time preset by the microprocessor 72, the slicer 66 again repeats this procedure, but this time with sixteen (16) progressive values in the slicer 66.

In this way, the slicer 66 initially provides a coarse control and, in subsequent time periods preset by the microprocessor 72, provides controls of progressively increasing sensitivity. These controls of progressively increasing sensitivity are fed by the slicer 66 to the stage 70, which produces the error signal that is fed back to the feed forward equalizer 40 and the decision feedback equalizer 52 to control the operation of coefficient updating loops in the equalizers. Upon each such feedback, the feed forward equalizer 40 and the decision feedback equalizer 52 adjust the values of the binary filter coefficients in the equalizers to provide an output of progressively increasing accuracy from the slicer 54.

Although the discussion above has centered specifically on the adder 48, the slicer 66 and the slicer 54, it will be appreciated that similar operations may be provided for a slicer (corresponding to the slicer 66) associated with the adder 50 and the slicer 56 to provide an output of progressively increasing accuracy from the slicer 56. As a result, the slicers 54 and 56 progressively provide, at successive instants of time, in-phase (I) and quadrature (Q) data estimates which progressively approach the values of the quadrature amplitude modulated data in the coaxial line 12.

In providing at progressive instants of time the outputs discussed in the previous paragraph, the slicer 66 in FIG. 5 provides at progressive instants of time two (2), four (4), eight (8) and sixteen (16) binary levels. The corresponding slicer associated with the adder 50 provides similar numbers of binary levels at progressive instants of time. Since the two (2) slicers respectively represent I and Q, they provide at successive instants of time four (4), sixteen (16), sixty four (64) and two hundred and fifty six (256) possible output pairs. This may be seen from the representation shown in FIG. 4 for the case of sixteen (16) outputs.

There are a number of closed loop servos which enhance the response of the system constituting this invention. One of these is indicated generally at 74 in FIG. 2B. It provides an automatic gain control for the analog signals introduced to the analog-digital converter 18. As will be appreciated, it is desirable to regulate the gain of the analog signals before they are converted to digital signals by the converter 18. One reason is that the amplitude of the analog signals at each instant affects the characteristics of the television information. The automatic gain control (AGC) servo 74 includes an AGC discriminant stage 76, an accumulator stage 78, a multiplier 80 and a digital-to-analog converter 82. The converter 82 may be a delta-sigma converter well known in the art. Although the stages 74, 76, 78, 80 and 82 may be considered to be individually known in the art, they are not known in the environment included in this invention for regulating the gain of the input to the analog-digital converter 18 in this invention.

Figure 2B:
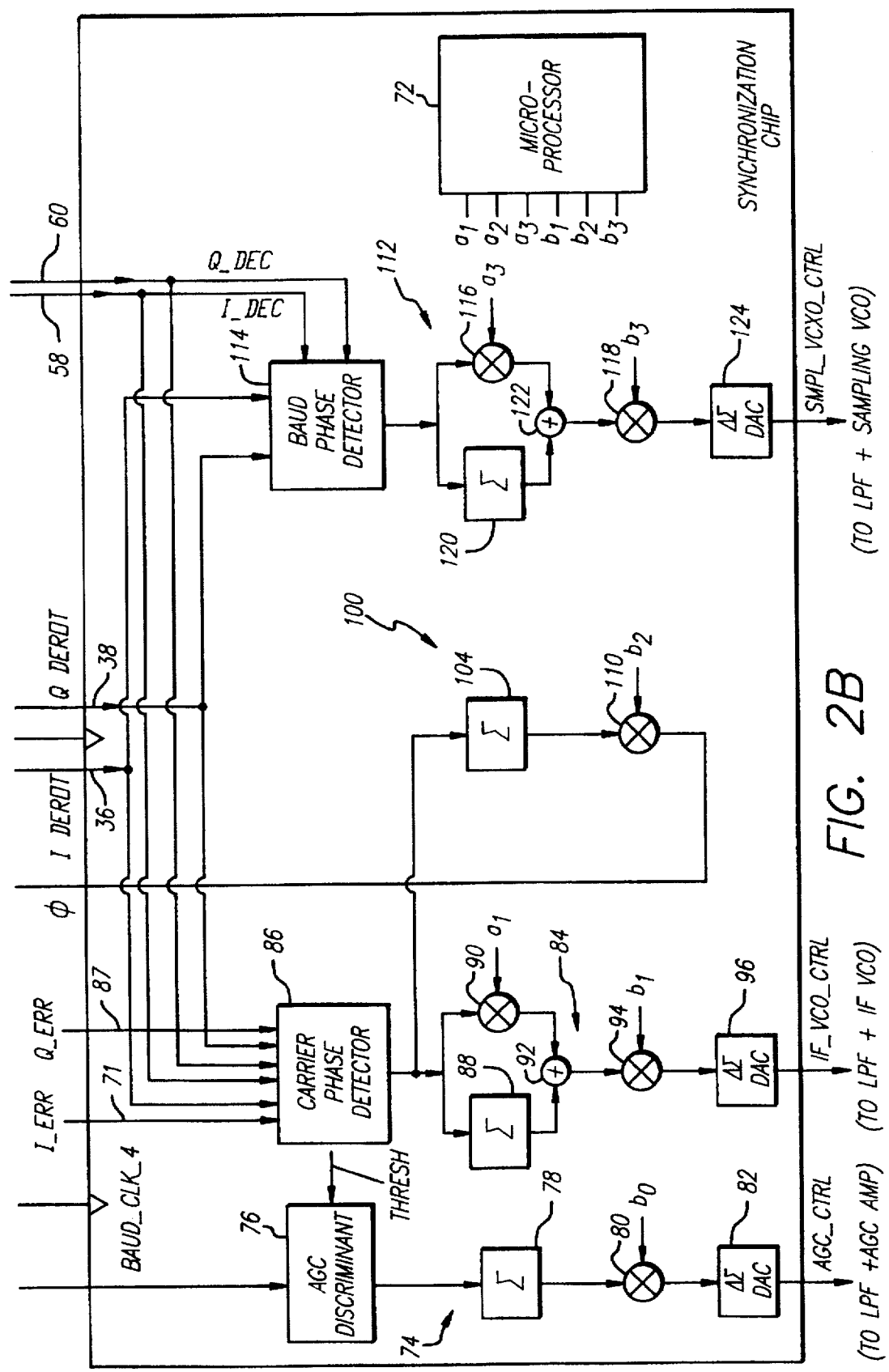

The AGC discriminant stage 76 initially provides a determination of the digital value (after conversion from analog) at a rate four (4) times the rate of the baud samples. This stage provides a close regulation of the gain in the analog signals. After a fixed time preset by the microprocessor 72, the AGC discriminant stage 76 provides a determination of the digital value (after conversion from analog) in every nth baud sample where n is an integer greater than one (1) and is preset by the microprocessor 72 (FIG. 2B).

The AGC discriminant stage 76 is able to operate in every nth sample because the stage has previously provided a strong (or coarse) regulation by determining and regulating the digital value at a rate four (4) times the rate of the baud samplings. Providing the determination in every nth baud sample after this initial strong (or coarse) regulation is desirable because it minimizes the consumption of power and because the circuitry for providing the determination in every nth baud sample is simpler than the circuitry for providing the determination at a rate four (4) times the rate of the baud samples.

The output from the AGC discriminant stage 76 is introduced to the accumulator 78 which operates to sum and average this output with the previous outputs from the stage 76. The multiplier 80 then multiplies the output from the accumulator 78 by a constant value $b_0$ preset by the microprocessor 72. The constant $b_0$ is initially set by the microprocessor 72 at a first fixed value. This first value for the constant $b_0$ is set so that the servo 74 can provide strong (or coarse) adjustments after the television station or channel 10 desired to be viewed has been changed.

After a fixed period of time preset by the microprocessor 72, the constant $b_0$ is changed by the microprocessor 72 to a second value. This second value of the constant $b_0$ provides for a weaker regulation than the first value of the constant $b_0$. This weaker regulation is quite satisfactory because of the previously strong (or coarse) regulation during the period of the first value of the constant. The output of the multiplier 80 is converted to an analog value by the converter 82. This analog value is used to regulate the gain of the analog signals introduced to the input to the analog-digital converter 18.

Another closed loop servo, generally indicated at 84 in FIG. 2B, corrects for the frequency of the variable frequency oscillator 14 (e.g. voltage controlled oscillator) to provide the oscillator with a frequency which differs from the carrier frequency for the selected station 10 by the intermediate frequency of five megahertz (5 MHz). In this way, a constant intermediate frequency can be provided regardless of which one of the stations 10 in the plurality is selected. The servo 84 includes an intermediate frequency (IF) carrier phase detector 86 having inputs respectively connected initially to the two (2) output lines 36 and 38 from the derotator 32 in FIG. 2A. The output lines 36 and 38 are respectively designated as IDEROT and QDEROT in FIG. 2A. Inputs to the intermediate carrier phase detector 86 are also respectively connected to the output lines 58 and 60 from the slicers 54 and 56.

As will be seen, the phase detector 86 has four (4) inputs. Two of these inputs may be considered as decision values and are obtained from the output lines 58 and 60. These decision values may be respectively designated as $\hat{I}$ and $\hat{Q}$. The outputs from the lines 36 and 38 may be respectively designated as I and Q. The four (4) inputs may be combined to obtain the following outputs:

$I\hat{Q}$ $Q\hat{I}$

These two (2) values are subtracted from each other as follows:

$I\hat{Q}-Q\hat{I}$

When there is no phase error in the output signals on the lines 58 and 60 relative to the ideal QAM constellation as shown in FIG. 4, $I\hat{Q}-Q\hat{I}=0$. When $I\hat{Q}-Q\hat{I}$ is different from zero (0), the magnitude of this difference represents the amount of the phase error in the output signals on the lines 58 and 60 relative to the ideal QAM constellation.

The phase error signal $I\hat{Q}-Q\hat{I}$ may be simplified in hardware by instead computing the following phase error term $$\text{sgn} [I \text{ sgn} (\hat{Q}) - Q \text{ sgn} (\hat{I})]$$

where the designation "sgn" in front of a term indicates whether the term is positive or negative. This simplified phase error term can be computed without the need for multiplications. This greatly simplifies the hardware implementation.

Figure 6:
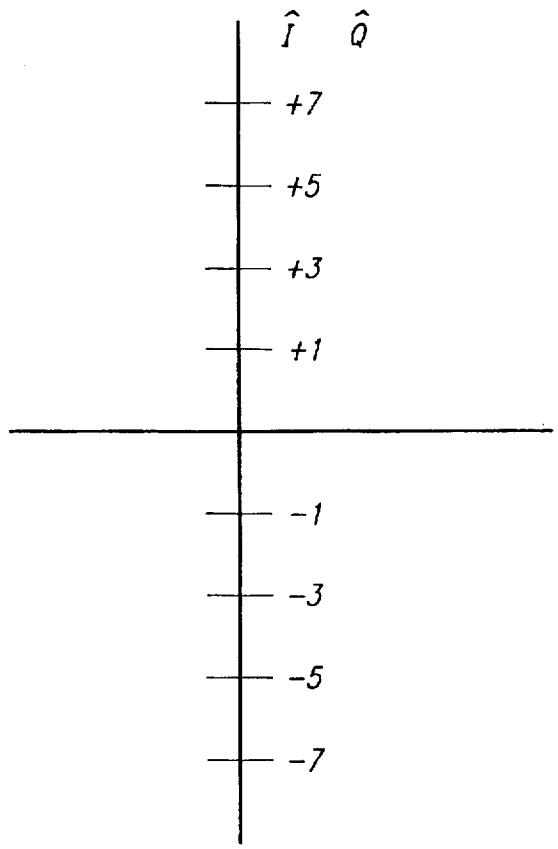
FIG. 6 is a chart further illustrating the possible output values of the slicer when operating in a 64-QAM mode.

As previously described, the decision values $\hat{Q}$ and $\hat{I}$ correspond to an individual one of a number of binary values. For example, FIG. 6 indicates four (4) binary values between zero (0) and plus seven (+7) and four (4) binary values between zero and minus seven (−7). One of these binary values is indicated at 89 in FIG. 7 for the case of 4-QAM. If there is a phase error between the outputs on the lines 58 and 60 and the ideal QAM constellation represented by the circles in FIG. 7, the I and Q outputs of the phase derotator 32 may be shifted to a position 91 in FIG. 7. As will be seen, this shift to the position 91 causes I to have an error indicated at 93 in FIG. 7 and Q to have an error indicated at 95 in FIG. 7. The phase detector 86 detects the difference 93 in the position between I and $\hat{I}$ along the vertical axis and the difference 95 in the position Q and $\hat{Q}$ along the horizontal axis and, on the basis of these differences, computes the phase error denoted by γ in FIG. 7.

The above phase detector technique is used in conjunction with a sweep circuit to obtain an initial coarse acquisition of the QAM signal. The sweep circuit is implemented under the control of the microprocessor 72 which provides a small positive or negative offset value at the input of an accumulator 88 in FIG. 2B. This offset causes the accumulator output to either ramp up or down depending on whether the offset was positive or negative. A digital-analog converter 96 converts these binary numbers to a ramping voltage which controls the variable frequency oscillator 14. This enables the oscillator 14 to sweep through a range of frequencies and thus match up exactly with the carrier frequency of the incoming QAM signal.

After a fixed period of time preset by the microprocessor 72, the phase detector technique is changed to provide a more precise, fine resolution, phase tracking capability. The fine resolution phase tracking algorithm is computed as $$e_I \hat{Q} - e_Q \hat{I}$$

where $e_I$ is the I channel slicer error on the line 71, and $e_Q$ is the channel slicer error 56 on a line 87 corresponding to the line 71. The phase error computation specified in the equation immediately above is similar to the coarse acquisition technique except that I and Q have been respectively replaced by $e_I$ and $e_Q$. The fine resolution phase error signal $e_I\hat{Q}-e_Q\hat{I}$ may be simplified in hardware by instead computing the following phase error term $$e_I \text{sgn} (\hat{Q}) - e_Q \text{sgn} (\hat{I})$$

This simplified phase error term can be computed without the need for multiplications. This greatly simplifies the hardware implementation. In these equations, the designation "Sgn" in front of a term indicates whether the term is positive or negative.

The output from the detector 86 is introduced to a pair of stages connected in parallel in FIG. 2B. One of these stages constitutes the accumulator 88 and the other stage constitutes a multiplier 90. The multiplier 90 is multiplied by a constant $a_1$ which is preset by the microprocessor 72. The multiplier 90 in effect damps the output of the accumulator 88 by a factor dependent upon the value of the constant $a_1$.

The accumulator 88 and the multiplier 90 provide outputs which are combined in an adder 92. The output from the adder 92 is introduced to a multiplier 94 which multiplies this output by a constant $b_1$ preset by the microprocessor 72. The output of the multiplier 94 is introduced to a digital-analog converter 96 which is well known in the art. For example, the converter 96 may be a delta-sigma type of converter. Stages such as the stages 88, 90, 92, 94 and 96 may be individually well known in the art but not in the environment shown in FIGS. 2A and 2B.

The servo 84 is shown as having two constants $a_1$ and $b_1$. Actually, each of these constants may have two (2) values. One of these values for each of the constants $a_1$ and $b_1$ may be provided by the microprocessor 72 for a fixed period of time after a change in the selection of the station or channel 10 to be viewed. In effect, these first values provide a coarse control over the frequency of the oscillator 14. After a fixed period of time preset by the microprocessor 72, each of the constants $a_1$ and $b_1$ is changed to a second value. In effect, this provides a fine control over the selection of the frequency in the oscillator 14. It will be appreciated that each of the first and second values of the constant $a_1$ may be different from each other and from the first and second values of the constants $b_0$ and $b_1$. This is also true of the other constants which will be discussed subsequently.

The digital signals on the output lines 36 and 38 and on the output lines 58 and 60 are initially introduced to the phase detector 86 to provide a strong, but coarse, control over the phases of the signals cos θ and sin θ. This control is particularly strong (or coarse) since the output of the derotator 32 is used to regulate the input to the derotator. After a fixed period of time preset by the microprocessor 72, the phase detector 86 receives the error output 71, and the slicer error output on the line 87 associated with the slicer 56 and corresponding to the line 71 and also receives the outputs on the lines 58 and 60. This provides a fine resolution phase control because, after equalizer convergence, the slicer error on the line 71 and the slicer error on the line corresponding to the slicer 71 are very precise.

The output of the detector 86 is also introduced to a filter stage, generally indicated at 100 consisting of an accumulator 104 and a multiplier 110. The output of the multiplier 110 is a filtered phase error term θ which is applied to the phase derotator blocks 32 and 34 to decrease the difference in phase between the signals from the derotator 32 and the QAM constellation. The filter stage 100 may also be considered as a servo.

The stage 110 multiplies the output from the accumulator 104 by a constant $b_2$. The constant $b_2$ has a first value preset by the microprocessor 72. After a fixed period of time preset by the microprocessor 72, the constant $b_2$ has another value. These different values are provided so that the servo 86 will be initially able to adapt on a coarse basis to a change in the station or channel 10 selected and the servo 100 will subsequently be able to operate on a fine basis to regulate the phases of the signals cos θ and sin θ.

Furthermore, the I Derot and Q Derot signals respectively on the lines 36 and 38 initially provide a coarse control in the operation of the servo 84 and the filter stage 100 when combined with the signals on the lines 58 and 60. Subsequently, the I error signals on the line 71 from the slicer 66 and the corresponding error signals on the line 97 from the slicer corresponding to the slicer 66 provide a fine control in the operation of the servos 84 and the filter stage 100 when combined with the signals on the lines 58 and 60.

The overall carrier tracking servo loop thus consists of two servos operating in parallel. The first servo 84 is a relatively slow reacting loop since it feeds all the way back to the variable frequency oscillator 14. The second servo 100 is a fast reacting loop which can track very rapid fluctuations in the phase of the incoming QAM signal. Each of these servos is considered to be an important feature of the invention. The combination of these servos in the manner described above is also considered to be an important feature of this invention.

Another closed loop servo generally indicated at 112 in FIG. 2B regulates the rate at which the analog-digital converter 18 converts the analog signals in the coaxial cable 12 to digital signals. This rate is regulated so that the digital conversion will occur at four (4) times the baud rate of the analog signals in the coaxial cable 12. The servo 112 includes the same stages as the servo 84. For example, a baud phase detector 114 receives the digital signals on the lines 36 and 38 and the lines 58 and 60 and computes a sampling phase error which is filtered as at 116, 118, 120 and 122, is converted from digital to analog as at 124 and is applied to a variable frequency oscillator 126 (FIG. 2A) which generates a master clock M-CLK as at 128 for the system. The two multipliers 116 and 118 in the servo 112 respectively receive constants $a_3$ and $b_3$ from the microprocessor 72. Each of these constants $a_3$ and $b_3$ initially has a first value and subsequently has a second value as described previously for other constants.

Figure 8:
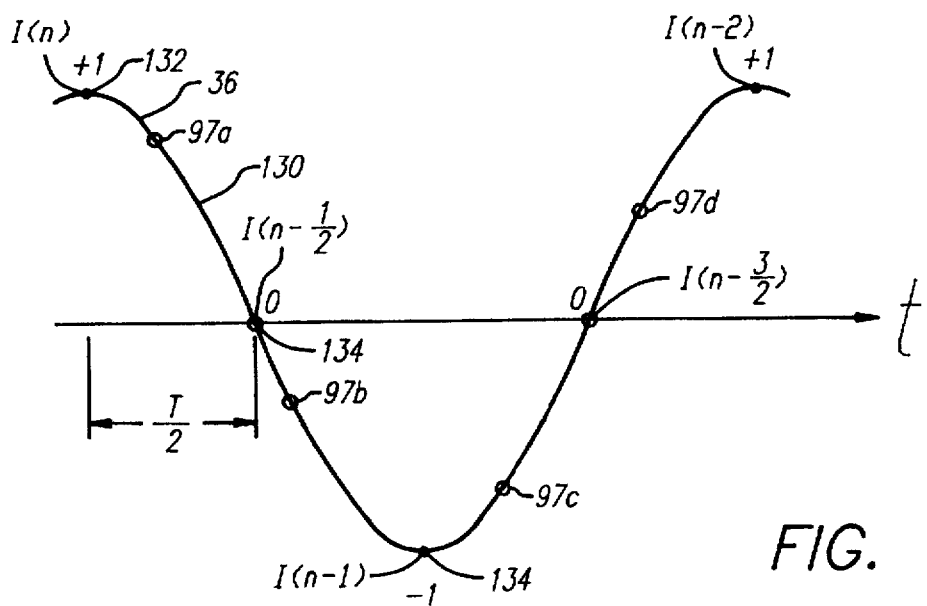
FIG. 8 is a curve further illustrating how the closed loop servos included in the embodiment of FIGS. 2A and 2B operate when the equalizer chip shown in FIG. 2A provides a QAM waveform with a sampling phase displaced from the ideal sampling phase generated by the transmitting station.

The operation of the baud phase detector 114 can be described by referencing FIG. 8. FIG. 8 illustrates an example of an I channel waveform 130 with a trajectory that traverses from +1 to −1 and back to +1, thereby crossing zero twice. The Q channel waveform (not shown in FIG. 8) has a trajectory similar to that of the I channel waveform 130 shown in FIG. 8. The frequency of occurrence of the derotator output samples on the lines 36 and 38 is twice the baud rate. Thus, the time interval between samples is T/2 as shown in FIG. 8 where T is the reciprocal of the baud rate.

If the analog-digital converter 18 is sampling the received QAM signal perfectly, then the derotator output samples will be +1, 0,−1,0,+1 as shown in FIG. 8. On the other hand, if, for example, the analog-digital converter 18 is sampling too late, then the derotator output samples will be 97a, 97b, 97c, and 97d. The baud phase detector 114 initially determines if a zero crossing has occurred, i.e., it checks to determine if sgn[Î(n)]≠sgn [Î(n−1)] where Î(n) and Î(n−1) are two consecutive slicer data decisions 132 and 134 in FIG. 8. If a zero crossing has occurred, then the baud phase error is sgn [Î(n)] sgn [I(n−½)] where I(n−½) is indicated at 136 in FIG. 8.

A similar computation is performed on the Q channel derotator output, i.e., if a Q channel zero crossing has occurred, then the Q channel baud phase error is $$\text{sgn } [\hat{Q}(n)] \text{ sgn } [Q(n-\tfrac{1}{2})]$$

The baud phase detector output can either be the I channel baud phase error, the Q channel baud phase error or the sum of the two:

$$\text{sgn}[\hat{I}(n)] \text{ sgn } [I(n-\tfrac{1}{2})]+\text{sgn } [\hat{Q}(n)] \text{ sgn } [Q(n-\tfrac{1}{2})]$$

In the preferred embodiment, the baud phase detector output is chosen as the sum of the I channel and Q channel phase errors.

In FIG. 2A, the variable frequency oscillator 126 provides a master clock signal. This signal has a suitable frequency such as approximately eighty (80) megahertz. This is higher than the baud rate. From this master clock, frequencies constituting (a) four (4) times the baud rate, (b) two (2) times the baud rate and (c) the baud rate are generated. These are designated in FIGS. 2A and 2B as "BAUD CLK 4", "BAUD CLK 2" and "BAUD CLK".

The system and method described above have certain important advantages. They can optimally detect the quadrature amplitude modulated data transmitted over the coaxial cable 12 with very low complexity. The system and method of this invention detect such quadrature amplitude modulated data in the lines 58 and 60 in FIG. 2A without being affected by any of the distortions in the coaxial cable 12. The detected data in the lines 58 and 60 can then be processed in a manner well known in the art to recover the television signals (video and audio). The recovered television signals are then processed to provide a television image and the accompanying sound.

The system and method of this invention employ techniques which have not previously been employed in systems and methods involving quadrature amplitude modulation and which provide for results significantly advanced in relation to the prior art. For example, the system and method of this invention employ digital signal processing techniques to provide on the lines 58 and 60 optimally detected QAM data which eliminate substantially all of the distortions in the coaxial cable. The system and method of this invention include the derotator 32 to improve the phase tracking capabilities in spite of the noise and distortion and include the symmetrical relationship of the stages in the equalizer chip 42 to significantly reduce hardware complexity. The system and method of this invention are also advantageous in employing the slicers 54 and 66 in FIG. 5 and in employing the slicer 56 and a slicer corresponding to the slicer 66 in providing this robust symmetric equalization. The system and method of this invention are further advantageous in providing the decision feedback equalizer 52 and the feed forward equalizer 40 in FIG. 2A to optimally correct for the distortion in the coaxial cable 12.

Servos are included in the system and method of this invention. These servos are believed to be broadly new and patentable in providing on the lines 58 and 60 QAM data which are substantially free of noise and distortion and which are provided with very accurate baud and carrier phases corresponding to the phases of the transmitted QAM signals in the coaxial cable 12. An individual one of the servos regulates the frequency of the signals from the oscillator 14 to obtain the intermediate frequency of five megahertz (5 MHz). Another one of the servos regulates the gain of the analog signals introduced in the coaxial cable 12 to the converter 18. A third one of the servos regulates the conversion of these analog signals to digital signals at four (4) times the baud rate. A fourth one of the servos regulates the phase and frequency of the cosine 0 and sine 0 signals introduced to the stage 34 so that the phase of the digital signals from the derotator 32 will correspond to the phase of the QAM signals in the coaxial cable 12.

The servos described in the previous paragraph have sophistications which further enhance their operation in providing on the output lines 58 and 60 quadrature amplitude demodulated signals free of the noise and distortions in the coaxial cable 12 and corresponding in baud and carrier phase to the phases of the quadrature amplitude modulated signals in the coaxial cable. One of these sophistications for three (3) of the four (4) servos is initially to use the signals on the lines 36 and 38 for regulation and subsequently to use the signals representing the slicer errors on the line 71 and the slicer error on the line corresponding to the line 71 for such regulation.

Another sophistication is the use of two parallel servos for carrier acquisition and tracking. One slow reacting servo controls the IF variable frequency oscillator to track the incoming frequency. The second fast reacting servo controls the phase derotator to track any phase variations on the incoming signal. Both effectively provide controls of frequency, one providing a coarse control and the other providing a fine control.

Another sophistication is to provide individual time constants in the different servos and to provide each of these time constants with a first value for a first period of time after a change in the individual one of the channels 10 selected and then with a second value after the first period of time. All of the sophistications specified in this paragraph and in the previous paragraphs cause each of the servos initially to provide a coarse control and subsequently to provide a fine control.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination for operating upon analog signals transmitted through a coaxial cable providing quadrature amplitude modulated data to recover the quadrature amplitude modulated data from noise and distortions in the coaxial cable, first means for converting the analog signals to analog signals having a particular intermediate frequency, second means for converting the analog signals at the particular intermediate frequency to corresponding digital signals, third means for operating upon the digital signals to provide the digital signals with a quadrature phase relationship, fourth means for passing the low frequency components in the digital signals with the quadrature phase relationship, fifth means for derotating the digital signals passed by the fourth means, sixth means responsive to the derotated digital signals for recovering, in digital form, the quadrature amplitude modulated data, the fifth means including seventh means for multiplying the output from the fourth means by trigonometric signals in a quadrature phase relationship to provide for a recovery in digital form of the quadrature amplitude modulated data from the noise and distortions in the coaxial cable, eighth means responsive to the derotated digital signals for producing error signals, and ninth means responsive to the error signals from the eighth means for regulating the analog signals from the first means at the particular intermediate frequency.

2. In a combination as set forth in claim 1, tenth means for equalizing the derotated signals from the fifth means, and eleventh means responsive to the outputs from the fifth means and the tenth means for providing a servo feedback to the fifth means to adjust the phases of the trigonometric signals form the seventh means for facilitating the recovery of the quadrature amplitude modulated data by the sixth means from the noise and distortions in the coaxial cable.

3. In a combination as set forth in claim 2, twelfth means for obtaining the recovery of the phase and amplitude modulations in the coaxial cable at the output of the tenth means.

4. In combination for operating upon analog signals transmitted through a coaxial cable using quadrature amplitude modulated data to recover the quadrature amplitude modulated data from noise in the coaxial cable, first means for converting the analog signals to corresponding digital signals, second means for operating upon the digital signals to provide a pair of the digital signals, one of the digital signals in the pair having a quadrature phase relationship to the other of the digital signals in the pair, third means for derotating the digital signals in the pair, and fourth means for equalizing the derotated signals from the third means, fifth means for providing progressive pluralities of values, each progressive plurality having a greater number of values than the numbers of values in the previous ones, of the progressive pluralities, sixth means for determining the individual one of the values in each of the progressive pluralities closest to the derotated equalized signals.

5. In a combination as set forth in claim 4, fifth means responsive to the signals from the third means and the fourth means for servoing the operation of the third means to facilitate the derotation of the digital signals in the pair.

6. In a combination as set forth in claim 4, the signals in the coaxial cable including carrier signals having a carrier frequency, seventh means for producing signals having a variable frequency, and eighth means responsive to the signals from the second means and the signals from the fourth means for varying the frequency of the signals from the seventh means to provide a difference of a particular intermediate frequency between the frequency of the carrier signals and the frequency of the signals from the oscillator, and the first means being operative to convert the signals at the particular intermediate frequency to the corresponding digital signals.

7. In a combination as set forth in claim 6, ninth means responsive to the signals from the first means for regulating the gain of the analog signals converted at the particular intermediate frequency by the first means to the corresponding digital signals.

8. In a combination as set forth in claim 6, tenth means responsive to the derotated signals from the third means and the derotated equalized signals from the fourth means for regulating the frequency of the intermediate frequency signals at the particular value.

9. In combination for operating upon analog signals transmitted through a coaxial cable using quadrature amplitude modulated data to recover the quadrature amplitude modulated data from noise and distortions in the coaxial cable, first means for converting the analog signals to digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, and fourth means responsive to the signals from the third means for providing a closed loop servo with the third means for locking the phases of the digital signals from the third means to the phases of the quadrature amplitude modulated signals in the coaxial cable, and fifth means for providing progressively refined approximations in the amplitudes of the digital signals in the pair to obtain a selection of an individual one of a plurality of binary values closest to the progressively refined approximations in the amplitudes of the digital signals in the pair.

10. In a combination as set forth in claim 9, the third means including sixth means for derotating the digital signals in the pair, and seventh means for recovering the quadrature amplitude modulated data from the individual one of the binary values in the plurality.

11. In combination for operating upon analog signals transmitted through a coaxial cable using quadrature amplitude modulated data to recover the quadrature amplitude modulated data from noise and distortions in the coaxial cable, first means for converting the analog signals to digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, and fourth means responsive to the signals from the third means for providing a closed loop servo with the third means for locking the phases of the digital signals from the third means to the phases of the quadrature amplitude modulated signals in the coaxial cable, the third means including a feed forward equalizer and a decision feedback equalizer and a pair of slicers each operable on an individual one of the digital signals in the pair to slice the digital signals into the closest of a number of binary values.

12. In a combination as set forth in claim 11, the third means including fifth means for derotating the digital signals in the pair, the fourth means being responsive to the derotated signals from the third means and to the digital signals from the slicers in the pair to lock the phases of the digital signals from the third means to the phases of the quadrature amplitude modulated signals in the coaxial cable.

13. In combination for operating upon analog signals transmitted through a coaxial cable using quadrature amplitude modulated data at a particular baud rate to recover the quadrature amplitude modulated data from noise and distortions in the coaxial cable, first means for converting the analog signals to digital signals at a variable rate, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, and fourth means responsive to the signals from the third means for varying the rate of converting the analog signals to the digital signals to provide the digital signals at a rate having a particular relationship to the particular baud rate, and fifth means for equalizing the digital signals in the pair from the second means, the fifth means being constructed to be symmetrical with respect to the second means to provide the same equalizations for the digital signals in the pair.

14. In a combination as set forth in claim 13, the third means including means for derotating the digital signals in the pair.

15. In combination for operating upon analog signals transmitted through a coaxial cable using quadrature amplitude modulated data at a particular baud rate to recover the quadrature amplitude modulated data from noise and distortions in the coaxial cable, first means for converting the analog signals to digital signals at a variable rate, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, and fourth means responsive to the signals from the third means for varying the rate of converting the analog signals to the digital signals to provide the digital signals at a rate having a particular relationship to the particular baud rate, the third means including a feed forward equalizer and a decision feedback equalizer and a pair of slicers each operable on an individual one of the digital signals in the pair to slice the digital signals into the closest of a number of binary values.

16. In a combination as set forth in claim 15, the third means including fifth means for derotating the digital signals in the pair, the fourth means being responsive to the derotated signals from the third means and to the digital signals from the slicers in the pair to lock the phases of the digital signals from the third means to the phases of the quadrature amplitude modulated signals in the coaxial cable.

17. In combination for operating upon analog signals transmitted through a coaxial cable using quadrature amplitude modulated data on a carrier signal of a particular frequency to recover the quadrature amplitude modulated data from noise and distortions in the coaxial cable, first means for converting the analog signals to digital signals at a variable rate, second means for operating upon the digital signals to provide a pair of digital signals, one of the digital signals in the pair having a quadrature phase relationship with the other of the digital signals in the pair, third means for adjusting the phases of the digital signals from the second means to conform to the phases of the analog signals in the coaxial cable, fourth means for providing an oscillator having a variable frequency, the fourth means being disposed before the first means in the combination, and fifth means responsive to the digital signals from the third means for varying the frequency of the oscillator to obtain the production, from the mixing of the analog signals and the oscillator signals, of intermediate frequency signals having a particular frequency, and sixth means responsive to the digital signals from the second means for servoing the operation of the fifth means to maintain the production of the intermediate frequency signals at the particular frequency.

18. In a combination as set forth in claim 17, the third means including means for derotating the digital signals in the pair.

19. In a combination as recited in claim 17, the sixth means including seventh means for servoing the operation of the fifth means at a first rate to maintain the production of the intermediate frequency signals at the particular frequency, the sixth means also including eighth means for servoing the operation of the fifth means at a second rate greater than the first rate to maintain the production of the intermediate frequency signals at the particular frequency.

20. In combination for operating upon analog signals transmitted through a coaxial cable using quadrature amplitude modulated data on a carrier signal of a particular frequency to recover the quadrature amplitude modulated data from noise and distortions in the coaxial cable, first means for converting the analog signals to digital signals at a variable rate, second means for operating upon the digital signals to provide a pair of digital signals, one of the digital signals in the pair having a quadrature phase relationship with the other of the digital signals in the pair, third means for adjusting the phases of the digital signals from the second means to conform to the phases of the analog signals in the coaxial cable, fourth means for providing an oscillator having a variable frequency, the fourth means being disposed before the first means in the combination, and fifth means responsive to the digital signals from the third means for varying the frequency of the oscillator to obtain the production, from the mixing of the analog signals and the oscillator signals, of intermediate frequency signals having a particular frequency, the third means including a feed forward equalizer and a decision feedback equalizer and a pair of slicers each operable on an individual one of the digital signals in the pair to slice the digital signals into the closest of a number of binary values.

21. In a combination as set forth in claim 20, the third means including fifth means for derotating the digital signals in the pair, the fourth means being responsive to the derotated signals from the third means and to the digital signals from the slicers in the pair to lock the variable frequency of the oscillator to obtain the production, from the mixing of the analog signals and the oscillator signals, of intermediate frequency signals having a particular frequency.

22. In combination for operating upon analog signals transmitted through a coaxial cable using quadrature amplitude modulated data at a particular baud rate to recover the quadrature amplitude modulated data from noise and distortions in the coaxial cable, first means for converting the analog signals to digital signals at a variable rate, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, fourth means responsive to the signals from the third means for providing a first closed loop servo with the third means for adjusting the operation of the first means to a rate having a particular relationship to the particular baud rate, fifth means responsive to the signals from the third means for providing a second closed loop servo with the third means for locking the phases of the pair of the digital signals from the third means to the phases of the quadrature amplitude modulated signals in the transmitter, and sixth means having inputs and outputs and operative in a closed loop between the inputs and the outputs for providing an equalization in the digital signals in the pair from the second means.

23. In a combination as set forth in claim 22, means responsive to the digital signals from the first means for regulating the amplitude of the digital signals.

24. In combination for operating upon analog signals transmitted through a coaxial cable using quadrature amplitude modulated data at a particular baud rate to recover the quadrature amplitude modulated data from noise and distortions in the coaxial cable, first means for converting the analog signals to digital signals at a variable rate, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, fourth means responsive to the signals from the third means for providing a first closed loop servo with the third means for adjusting the operation of the first means to a rate having a particular relationship to the particular baud rate, and fifth means responsive to the signals from the third means for providing a second closed loop servo with the third means for locking the phases of the pair of the digital signals from the third means to the phases of the quadrature amplitude modulated signals in the transmitter, the fourth means including a first digital-to-analog converter for converting the digital signals from the third means to corresponding analog signals for adjusting the operation of the first means to a rate having the particular relationship to the particular baud rate, and the fifth means including a second digital-to-analog converter for converting the digital signals from the third means to corresponding analog signals for locking the phases of the pair of the digital signals from the third means to the phases of the quadrature amplitude modulated signals in the coaxial cable.

25. In combination for operating upon analog signals transmitted through a coaxial cable using quadrature amplitude modulated data at a particular baud rate to recover the quadrature amplitude modulated data from noise and distortions in the coaxial cable;

first means for converting the analog signals to digital signals at a variable rate, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, fourth means responsive to the signals from the third means for providing a first closed loop servo with the third means for adjusting the operation of the first means to a rate having a particular relationship to the particular baud rate, and fifth means responsive to the signals from the third means for providing a second closed loop servo with the third means for locking the phases of the pair of the digital signals from the third means to the phases of the quadrature amplitude modulated signals in the transmitter, the quadrature amplitude modulated analog signals in the coaxial cable including carrier signals at a particular frequency, and sixth means for providing signals having a variable frequency, and seventh means responsive to the pair of the digital signals from the third means and to the carrier signals at the first particular frequency for varying the frequency of the signals from the sixth means to obtain, upon a mixture of the signals from the sixth means and the carrier signals, intermediate frequency signals having a second particular frequency.

26. In combination for operating upon analog signals transmitted through a coaxial cable using quadrature amplitude modulated data at a particular carrier frequency to recover the quadrature amplitude modulated data from noise and distortions in the coaxial cable, first means for converting the analog signals to digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, fourth means responsive to the signals from the third means for providing a first closed loop with the third means for locking the phases of the pair of the digital signals from the third means to the phases of the quadrature amplitude modulated signals in the coaxial cable, fifth means for providing signals having a variable frequency, and sixth means responsive to the signals from the third means for providing a second closed loop with the third means for varying the frequency of the signals from the fifth means to obtain, upon a mixture of the signals at the carrier frequency and the signals having the variable frequency, intermediate frequency signals having a particular frequency.

27. In a combination as set forth in claim 26, means responsive to the analog signals from the first means for regulating the amplitude of the analog signals.

28. In a combination as set forth in claim 26, the third means including seventh means for derotating the digital signals in the pair and further including eighth means for equalizing the derotated digital signals in the pair from the seventh means.

29. In combination for operating upon analog signals transmitted through a coaxial cable using quadrature amplitude modulated data at a particular carrier frequency to recover the quadrature amplitude modulated data from noise and distortions in the coaxial cable, first means for converting the analog signals to digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, fourth means responsive to the signals from the third means for providing a first closed loop with the third means for locking the phases of the pair of the digital signals from the third means to the phases of the quadrature amplitude modulated signals in the coaxial cable, fifth means for providing signals having a variable frequency, and sixth means responsive to the signals from the third means for providing a second closed loop with the third means for varying the frequency of the signals from the fifth means to obtain, upon a mixture of the signals at the carrier frequency and the signals having the variable frequency, intermediate frequency signals having a particular frequency, the fourth means including a first digital-to-analog converter for converting the pair of the digital signals from the third means to corresponding analog signals for adjusting the operation of the third means to lock the phases of the pair of the digital signals from the third means to the phases of the quadrature amplitude modulated signals in the coaxial cable, the sixth means including a second digital-to-analog converter for converting the digital signals from the third means to corresponding analog signals for locking the frequency of the signals from the fifth means relative to the carrier frequency for obtaining the intermediate frequency signals with a particular frequency.

30. In a combination as set forth in claim 29, seventh means responsive to the analog signals from the first means for regulating the amplitude of the analog signals, and the third means including eighth means for derotating the digital signals in the pair and further including ninth means for equalizing the derotated digital signals in the pair from the eighth means.

31. In combination for operating upon analog signals transmitted through a coaxial cable using quadrature amplitude modulated data to recover the quadrature amplitude modulated data from noise and distortions in the coaxial cable, first means for converting the analog signals to digital signals, second means for operating upon the digital signals to provide a pair of the digital signals, one of the digital signals in the pair having a quadrature phase relationship with the other of the digital signals in the pair, and third means for adjusting the phases of the digital signals in the pair to conform to the phases of the quadrature amplitude modulated signals in the coaxial cable, the third means including a feed forward equalizer and a decision feedback equalizer, the decision feedback equalizer including a pair of slicers each operable on an individual one of the digital signals in the pair to slice the digital signals into the closest of a number of binary values, the number being progressively increased with time.

32. In a combination as set forth in claim 31, the decision feedback equalizer having an output connected to the feed forward equalizer to control the operation of the feed forward equalizer in accordance with the operation of the decision feedback equalizer.

33. In a combination as set forth in claim 31, the pair of the slicers constituting a first pair, each of the slicers in the first pair being operable on an individual one of the digital signals in the pair to slice the digital signals into the closest of a number of binary values and the third means including a second pair of slicers each operative to progressively increase the number of the binary values with time.

34. In a combination as set forth in claim 31, the feed forward equalizer being operative to correct for distortions in a leading portion of the digital signals in the pair and the decision feedback analyzer being operative to correct for distortions in a trailing portion of the digital signals in the pair.

35. In a combination as set forth in claim 34, the output of the decision feedback equalizer being introduced to the feed forward equalizer to enhance the operation of the feed forward equalizer, the feed forward equalizer being operative to correct for distortions in a leading portion of the digital signals in the pair and the decision feedback analyzer being operative to correct for distortions in a trailing portion of the digital signals in the pair.

36. In combination for operating upon analog signals transmitted through a coaxial cable using quadrature amplitude modulated data to recover the quadrature amplitude modulated data from noise and distortions in the coaxial cable, first means for converting the analog signals to digital signals, second means for operating upon the digital signals to provide a pair of the digital signals, one of the digital signals in the pair having a quadrature phase relationship with the other of the digital signals in the pair, and third means for adjusting the phases of the digital signals in the pair to conform to the phases of the quadrature amplitude modulated signals in the coaxial cable, the third means including a feed forward equalizer and a decision feedback equalizer, the decision feedback equalizer including a first pair of slicers each operable on an individual one of the digital signals in the pair to slice the digital signals into the closest of a number of binary values, the number being progressively increased with time, the decision feedback equalizer having an output connected to the feed forward equalizer to control the operation of the feed forward equalizer in accordance with the operation of the decision feedback equalizer, a second pair of slicers, the third means including a pair of adders each operative to receive the output of the decision feedback equalizer and the output of the feed forward equalizer and each operative to introduce its output to an individual one of the slicers in the second pair.

37. In a combination as set forth in claim 36, means responsive to the output from the third means for feeding the output back to the third means to facilitate the adjustment of the amplitudes and phases of the digital signals in the pair to conform to the amplitudes and phases of the quadrature amplitude modulated signals in the transmitter.

38. In combination for operating upon analog signals transmitted through a coaxial cable using quadrature amplitude modulated data to recover the quadrature amplitude modulated data from noise and distortion in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, the third means including fourth means for derotating the phases of the digital signals in the pair and including fifth means for providing a feed forward equalization of the derotated digital signals in the pair and including sixth means for providing a decision feedback equalization of the signals from the fifth means, the fifth means and the sixth means being connected in an asymmetrical relationship.

39. In a combination as set forth in claim 38, means for feeding the signals from the sixth means back to the fifth means to enhance the feed forward equalization provided by the fifth means.

40. In combination for operating upon analog signals transmitted through a coaxial cable using quadrature amplitude modulated data to recover the quadrature amplitude modulated data from noise and distortion in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, the third means including fourth means for derotating the phases of the digital signals in the pair and including fifth means for providing a feed forward equalization of the derotated digital signals in the pair and including sixth means for providing a decision feedback equalization of the signals from the fifth means, the decision feedback equalizer including a pair of slicers each operable on an individual one of the digital signals in the pair to slice the digital signals into the closest of a number of binary values, the number being progressively increased with time.

41. In a combination as set forth in claim 40, a pair of adders each operatively coupled to the feed forward equalizer and the decision feedback equalizer to operate upon one of the digital signals in the pair, and a pair of additional slicers each operatively coupled to an individual one of the adders in the pair to provide an output of one of the digital signals in the pair without the noise and distortion in the coaxial cable.

42. In a combination as set forth in claim 41, the feed forward equalizer and the decision feedback equalizer being connected in a symmetrical relationship with each individual one of the adders, the slicers and the additional slicers relative to the connection of the feed forward equalizer and the decision feedback analyzer with the other one of the adders, the slicers and the additional slicers, and means for feeding the signals from the fifth means back to the fifth means to enhance the feed forward equalization provided by the fifth means.

43. In a combination as set forth in claim 40, seventh means for feeding the signals from the sixth means back to the fifth means to enhance the feed forward equalization provided by the fifth means.

44. In combination for operating upon analog signals transmitted through a coaxial cable using quadrature amplitude modulated data to recover the quadrature amplitude modulated data from noise and distortion in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, the third means including fourth means for derotating the phases of the digital signals in the pair and including fifth means for equalizing the derotated digital signals in the pair, and fifth means responsive to the derotated digital signals in the pair and to the equalized digital signals in the pair for operating upon the fourth means to facilitate the derotation of the digital signals in the pair by the fourth means.

45. In a combination as set forth in claim 44, means for providing an automatic gain control of the digital signals from the second means.

46. In combination for operating upon analog signals transmitted through a coaxial cable using quadrature amplitude modulated data to recover the quadrature amplitude modulated data from noise and distortion in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, the third means including fourth means for derotating the phases of the digital signals in the pair and including fifth means for equalizing the derotated digital signals in the pair, the quadrature amplitude modulated signals in the coaxial cable having a particular baud rate, and means responsive to the derotated digital signals and to the equalized digital signals for operating upon the first means to obtain the conversion of the analog signals to the digital signals at a rate having a particular relationship to the particular baud rate.

47. In combination for operating upon analog signals transmitted through a coaxial cable using quadrature amplitude modulated data to recover the quadrature amplitude modulated data from noise and distortion in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, the third means including fourth means for derotating the phases of the digital signals in the pair and including fifth means for equalizing the derotated digital signals in the pair, the signals in the coaxial cable including carrier signals with a particular carrier frequency, and an oscillator having a variable frequency, and means responsive to the derotated digital signals and the equalized digital signals for varying the frequency of the oscillator to provide, upon a mixing of the analog signals and the signals from the oscillator, intermediate frequency signals having a particular frequency.

48. In combination for operating upon analog signals transmitted through a coaxial cable using quadrature amplitude modulated data to recover the quadrature amplitude modulated data from noise and distortions in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, the third means including a derotator and an equalizer, the equalizer including a feed forward equalizer and a decision feedback equalizer, and servo means responsive to the outputs of the derotator and the equalizer for adjusting the operation of the derotator and the equalizer to adjust the phases of the digital signals in the pair from the third means to conform to the phases of the quadrature amplitude modulated signals in the coaxial cable.

49. In combination for operating upon analog signals transmitted through a coaxial cable using quadrature amplitude modulated data to recover the quadrature amplitude modulated data from noise and distortions in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, the third means including a derotator, a feed forward equalizer and a decision feedback equalizer, means responsive initially to the outputs of the derotator and the decision feedback equalizer, and subsequently to signals from the feed forward equalizer and the decision feedback analyzer, for operating upon the derotator to facilitate the derotation of the phases of the digital signals in the pair in phase with the quadrature amplitude modulated signals in the coaxial cable.

50. In combination for operating upon analog signals transmitted through a coaxial cable using quadrature amplitude modulated data to recover the quadrature amplitude modulated data from noise and distortions in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, the third means including a derotator, a feed forward equalizer and a decision feedback equalizer, the quadrature amplitude modulated signals in the coaxial cable having a particular baud rate, and servo means responsive to the outputs of the derotator and the decision feedback equalizer for operating upon the first means to obtain the conversion of the analog signals to the digital signals at a rate having a particular relationship to the particular baud rate.

51. In a combination as set forth in claim 50, the servo means being initially responsive to the outputs of the derotator and the decision feedback equalizer, and being subsequently responsive to the outputs of the feed forward equalizer and the decision feedback equalizer, for operating upon the first means to obtain the conversion of the analog signals to the digital signals at a rate having a particular relationship to the particular baud rate.

52. In combination for operating upon analog signals transmitted through a coaxial cable using quadrature amplitude modulated data to recover the quadrature amplitude modulated data from noise and distortions in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated signals in the coaxial cable, the third means including a derotator, a feed forward equalizer and a decision feedback equalizer, the signals in the coaxial cable including carrier signals with a particular carrier frequency, an oscillator having a variable frequency, and means responsive initially to the outputs of the derotator and the decision feedback equalizer, and subsequently to the outputs of the feed forward equalizer and the decision feedback equalizer, for varying the frequency of the oscillator to obtain, upon a mixing of the carrier signals and the signals from the oscillator, intermediate frequency signals having a particular frequency.

53. In combination for operating upon analog signals transmitted through a coaxial cable using quadrature amplitude modulation data to recover the quadrature amplitude modulated data from noise and distortion in the coaxial cable, first means for converting the analog signals in the coaxial cable to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated data in the coaxial cable, the third means including a feed forward equalizer and a decision feedback equalizer and means for combining the outputs of the feed forward equalizer and the decision feedback equalizer to obtain resultant decisions and including means for providing progressive slicings of the resultant decisions to obtain the quadrature amplitude modulated data free from noise and distortions, the number of the levels in each progressive slicing being greater than the number of the levels in the preceding slicings and the successive levels in each progressive slicing being closer together than the successive levels in the preceding slicings.

54. In combination for operating upon analog signals transmitted through a coaxial cable using quadrature amplitude modulation data to recover the quadrature amplitude modulated data from noise and distortion in the coaxial cable, first means for converting the analog signals in the coaxial cable to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated data in the coaxial cable, the third means including a feed forward equalizer and a decision feedback equalizer and means for combining the outputs of the feed forward equalizer and the decision feedback equalizer to obtain resultant decisions and including means for slicing the resultant decisions to obtain the quadrature amplitude modulated data free from noise and distortions, the decision feedback equalizer including an additional slicer connected to receive the output of the combining means and to provide, at progressive instants of time, binary outputs of progressive sensitivity and including means for determining any difference between the output of the combining means and the binary outputs of progressive sensitivity and including means for introducing the difference determinations to the feed forward equalizer and decision feedback equalizer to enhance the equalizing operation of the feed forward equalizer and the decision feedback equalizer.

55. In combination for operating upon analog signals transmitted through a coaxial cable using quadrature amplitude modulation data to recover the quadrature amplitude modulated data from noise and distortion in the coaxial cable, first means for converting the analog signals in the coaxial cable to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated data in the coaxial cable, the third means including a feed forward equalizer and a decision feedback equalizer and means for combining the outputs of the feed forward equalizer and the decision feedback equalizer to obtain resultant decisions and including means for slicing the resultant decisions to obtain the quadrature amplitude modulated data free from noise and distortions, control means responsive to the outputs of the feed forward equalizer and the decision feedback equalizer for providing a closed loop servo in the third means to enhance the operation of the third means in producing the quadrature amplitude modulated data without noise and distortions.

56. In combination for operating upon analog signals transmitted through a coaxial cable using quadrature amplitude modulation data to recover the quadrature amplitude modulated data from noise and distortion in the coaxial cable, first means for converting the analog signals in the coaxial cable to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated data in the coaxial line, the third means including a feed forward equalizer and a decision feedback equalizer and means for combining the outputs of the feed forward equalizer and the decision feedback equalizer to obtain resultant decisions and including means for slicing the resultant decisions to obtain the quadrature amplitude modulated data free from noise and distortions, the quadrature amplitude modulated signals in the coaxial cable occurring at a particular baud rate, and means responsive to the outputs of the third means and the slicing means for providing a closed loop servo to provide for the operation of the first means in converting the analog signals to the digital signals at a rate having a particular relationship to the particular baud rate.

57. In combination for operating upon analog signals transmitted through a coaxial cable using quadrature amplitude modulation data to recover the quadrature amplitude modulated data from noise and distortion in the coaxial cable, first means for converting analog signals to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to conform to the phases of the quadrature amplitude modulated data in the coaxial line, the third means including a feed forward equalizer and a decision feedback equalizer and means for combining the outputs of the feed forward equalizer and the decision feedback equalizer to obtain resultant decisions and including means for slicing the resultant decisions to obtain the quadrature amplitude modulated data free from noise and distortions, the quadrature amplitude modulated signals in the coaxial cable having a particular carrier frequency, and an oscillator having a variable frequency, and means responsive to the outputs of the feed forward equalizer and the decision feedback equalizer for varying the frequency of the oscillator to provide, upon a mixing of the signals at the particular carrier frequency and the oscillator signals, intermediate frequency signals having a particular frequency, the first means being operative to convert to the digital signals the intermediate frequency signals having the particular frequency.

58. In combination for operating upon analog signals transmitted through a coaxial cable using quadrature amplitude modulated data to recover the quadrature amplitude modulated data from noise and distortions in the coaxial cable, first means for converting the analog signals to corresponding digital signals, second means for operating upon the digital signals to provide a pair of the digital signals, one of the digital signals in the pair having a quadrature phase relationship with the other of the digital signals in the pair, third means for derotating the phases of the digital signals in the pair, and fourth means including first and second paths each responsive to an individual one of the derotated digital signals in the pair from the third means in a symmetrical relationship with the other one of the derotated signals in the pair for equalizing the derotated digital signals in the pair.

59. In a combination as set forth in claim 58, means responsive to the signals from the third means and the equalized signals from the fourth means for providing a closed loop servo for facilitating the derotation by the third means of the digital signals in the pair.

60. In a combination as set forth in claim 58, the quadrature amplitude modulated signals in the coaxial cable having a particular baud rate, and means responsive to the signals from the third means and the equalized signals from the fourth means for providing a closed loop servo for providing for the operation of the first means at a rate having a particular relationship to the particular baud rate in converting the analog signals in the coaxial cable to the corresponding digital signals.

61. In a combination as set forth in claim 58, the quadrature amplitude modulated signals in the coaxial cable having a particular carrier frequency, an oscillator having a variable carrier frequency, and means responsive to the signals from the third means and the equalized signals from the fourth means for providing a closed loop servo for maintaining the operation of the oscillator in producing analog signals at a frequency related to the particular carrier frequency.

the oscillator being responsive to the analog signals in the coaxial cable before the operation of the first means in converting the analog signals in the receiver to the corresponding digital signals and the first means being operative to convert, to the corresponding digital signals, the analog signals at the frequency related to the particular carrier frequency.

62. In combination for operating upon analog signals transmitted through a coaxial cable using quadrature amplitude modulated data to recover the quadrature amplitude modulated data from noise and distortions in the coaxial cable, there being a plurality of stations each providing an individual carrier frequency for the analog signals from such station and each providing quadrature amplitude modulated signals in the coaxial cable, first means for converting the analog signals at the individual carrier frequency for each of the stations to analog signals at a particular intermediate frequency, second means for converting the analog signals at the particular intermediate frequency to corresponding digital signals, third means for operating upon the digital signals from the second means to provide a pair of the digital signals, one of the digital signals in the pair having a quadrature phase relationship with the other of the digital signals in the pair, fourth means for adjusting the phases of the digital signals in the pair to recover the quadrature amplitude modulated data from the noise and distortions in the coaxial cable, and fifth means responsive to the output from the third means for providing a closed loop servo with the fourth means for facilitating the recovery of the quadrature amplitude modulated data from the noise and distortions in the coaxial cable, the fifth means initially having a first response for a first period of time after switching from a first one of the stations in the plurality to a second one of the stations in the plurality to facilitate the recovery of the analog signals at the particular intermediate frequency from the carrier frequency of the second one of the stations in the plurality and subsequently having a second response after the first period of time to facilitate the recovery of the quadrature amplitude modulated data for the second one of the stations in the plurality from the noise and distortions in the coaxial cable.

63. In a combination as set forth in claim 62, the fifth means including means for converting the digital indications from the fourth means to analog signals for facilitating the recovery of the quadrature amplitude modulated data for the second one of the stations in the plurality from the noise and distortions in the coaxial cable.

64. In a combination as set forth in claim 62, the fifth means including sixth means responsive to the digital signals from the fourth means for adjusting the phases of the digital signals in the pair to facilitate the recovery of the quadrature amplitude modulated data for the second one of the stations in the plurality from the noise and distortions in the coaxial cable.

65. In a combination as set forth in claim 62, sixth means operatively coupled to the fourth means and the fifth means and operative in a closed loop servo for maintaining at the particular intermediate frequency the analog signals from the first means.

66. In a combination as set forth in claim 65, the analog signals at the particular intermediate frequency being sampled at a rate having a particular relationship to the particular baud rate, the fifth means being responsive to the digital signals from the third means for adjusting, to a particular rate, the operation of the first means in converting the analog signals to the digital signals.

67. In combination for operating upon analog signals transmitted through a coaxial cable using quadrature amplitude modulated data to recover the quadrature amplitude modulated data from the noise and distortions in the coaxial cable, first means for converting the analog signals in the coaxial cable to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to recover the quadrature amplitude modulated data from the noise and distortions in the coaxial cable, the third means including a feed forward equalizer and a decision feedback analyzer, the third means including slicer means operative upon the digital signals in individual ones of the pairs to conform such digital signals to the closest of individual ones of a plurality of different levels, the slicer means being operative at successive periods of time to provide progressive numbers of levels in the plurality for conforming such digital signals, fourth means responsive to the outputs of the feed forward equalizer and the decision feedback equalizer and the slicer means for producing an error signal, and fifth means for feeding the error signal back to the feed forward equalizer and the decision feedback equalizer for adjusting the operation of the feed forward equalizer and decision feedback equalizer in accordance with such error signal.

68. In a combination as set forth in claim 67, the analog signals occurring at a particular baud rate, and means responsive to the quadrature amplitude modulated data in the third means and the quadrature amplitude modulated data from the additional slicer means for controlling the operation of the first means to provide for the conversion of the analog signals to the digital signals at a rate having a particular relationship to the particular baud rate.

69. In combination for operating upon analog signals transmitted through a coaxial cable using quadrature amplitude modulated data to recover the quadrature amplitude modulated data from the noise and distortions in the coaxial cable, first means for converting the analog signals in the coaxial cable to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to recover the quadrature amplitude modulated data from the noise and distortions in the coaxial cable, the third means including a feed forward equalizer and a decision feedback equalizer, the third means including slicer means operative upon the digital signals in individual ones of the pairs to conform the amplitudes of such digital signals to the closest of individual ones of a plurality of different levels, the slicer means being operative at successive periods of time to provide progressive numbers of levels in the plurality for conforming the amplitudes of such digital signals, means responsive to the outputs of the feed forward equalizer and the decision feedback equalizer and the slicer means for producing an error signal, and means for feeding the error signal back to the feed forward equalizer and the decision feedback equalizer for adjusting the operation of the feed forward equalizer and the decision feedback equalizer to minimize such error signal.

70. In a combination as set forth in claim 69, means responsive to the outputs of the decision feedback equalizer and the slicer means for combining such outputs, and a pair of additional slicer means each responsive to the combined outputs of the decision feedback equalizer and the slicer means for providing the quadrature amplitude modulated data without the noise and distortions in the coaxial cable.

71. In a combination as set forth in claim 70, means responsive to the quadrature amplitude modulated data in the third means and the quadrature amplitude modulated data from the additional slicer means for feeding signals back to the third means to facilitate the recovery of the quadrature amplitude modulated data by the third means.

72. In a combination as set forth in claim 70, there being a carrier signal at a particular frequency for the quadrature amplitude modulated signals in the coaxial cable, an oscillator having a variable frequency, and means responsive to the quadrature amplitude modulated data in the third means and the quadrature amplitude modulated data from the additional slicer means for varying the frequency of the oscillator to obtain, from a mixing of the carrier signal and the signal from the local oscillator, an intermediate frequency signal having a particular frequency.

73. In combination for operating upon analog signals transmitted through a cable using quadrature amplitude modulated data to recover the quadrature amplitude modulated data from the noise and distortions in the coaxial cable, there being a plurality of stations each having an individual carrier frequency and each providing quadrature amplitude modulated signals in the coaxial cable, first means for converting the analog signals in the coaxial cable to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to recover the quadrature amplitude modulated data from the noise and distortions in the coaxial cable, and fourth means responsive to the indications from the first means for regulating the gain of the analog signals before the conversion of the analog signals to the digital signals by the first means, the fourth means having a first response for a first period of time after switching from a first one of the stations in the plurality to a second one of the stations in the plurality and subsequently having a second response after the first period of time to facilitate the recovery of the quadrature amplitude modulated data for the second one of the stations in the plurality from the noise and distortions in the coaxial cable.

74. In a combination as set forth in claim 73, the fourth means including means for converting the digital indications from the first means to analog indications for regulating the gain of the analog signals in the coaxial cable.

75. In a combination as set forth in claim 73, the analog signals having a particular baud rate, and means for regulating the rate of conversion by the first means of the analog signals to the digital signals to correspond to a rate having a particular relationship to the baud rate of the analog signals.

76. In a combination as set forth in claim 73, the analog signals having a particular carrier frequency, an oscillator having a variable frequency, fifth means for mixing the signals from the oscillator with the analog signals in the coaxial cable before the conversion of the analog signals to the digital signals by the first means to obtain analog signals at an intermediate frequency, and sixth means for regulating the variable frequency of the oscillator to maintain the analog signals from the fifth means at the particular intermediate frequency, the first means being operative to convert the analog signals at the particular intermediate frequency to the corresponding digital signals.

77. In combination for operating upon analog signals transmitted through a cable using quadrature amplitude modulated data to recover the quadrature amplitude modulated data from the noise and distortions in the coaxial cable, there being a plurality of stations each having an individual carrier frequency and each providing quadrature amplitude modulated signals in the coaxial cable, first means for converting the analog signals in the coaxial cable to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to recover the quadrature amplitude modulated data from the noise and distortions in the coaxial cable, and fourth means responsive to the indications from the first means for regulating the gain of the analog signals before the conversion of the analog signals to the digital signals by the first means, the fourth means having a first response for a first period of time after switching from a first one of the stations in the plurality to a second one of the stations in the plurality and subsequently having a second response after the first period of time to facilitate the recovery of the quadrature amplitude modulated data for the second one of the stations in the plurality from the noise and distortions in the coaxial cable, the fourth means being responsive to every digital conversion by the first means for the first period of time and being responsive to every nth conversion by the first means after the first period of time where n is an integer greater than 1.

78. In combination for acting upon analog signals transmitted through a cable using quadrature amplitude modulated data to recover the quadrature amplitude modulated data from the noise and distortions in the coaxial cable, first means for converting the analog signals in the coaxial cable to corresponding digital signals, second means for operating upon the digital signals to provide a pair of the digital signals, one of the digital signals in the pair having a quadrature phase relationship with the other of the digital signals in the pair, third means for adjusting the phases of the digital signals in the pair to recover the quadrature amplitude modulated data from the noise and distortions in the coaxial cable, the third means including a feed forward equalizer and a decision feedback equalizer connected to receive the output of the feed forward equalizer and including means for feeding the output of the decision feedback equalizer to the feed forward equalizer to regulate the operation of the feed forward equalizer in adjusting the amplitudes and phases of the digital signals in the pair to recover the quadrature amplitude modulated data from the noise and distortions in the coaxial cable.

79. In a combination as set forth in claim 78, means for adding the outputs of the feed forward equalizer and the decision feedback equalizer, and means responsive to the outputs of the adding means for providing the quadrature amplitude modulated data without the noise and distortions in the coaxial cable.

80. In a combination as set forth in claim 78, the decision feedback equalizer having a pair of slicers each operative to provide outputs of increased sensitivity at progressive instants of time and including means responsive to the outputs of the slicers and the outputs of the decision feedback equalizers for producing error signals for regulating the operation of the feed forward equalizer and decision feedback equalizer.

81. In a combination as set forth in claim 80, a second pair of slicers responsive to the outputs of the feed forward equalizer and the decision feedback equalizer for combining these outputs to obtain the quadrature amplitude modulated data without the noise and distortions in the coaxial cable.

* * * * *